(12) United States Patent
Goka (10) Patent No.: US 10,720,745 B2
(45) Date of Patent: Jul. 21, 2020

(54) ATOMIC OSCILLATOR

(71) Applicant: TOKYO METROPOLITAN UNIVERSITY, Tokyo (JP)

(72) Inventor: Shigeyoshi Goka, Tokyo (JP)

(73) Assignee: Tokyo Metropolitan University, Tokyo (JP)

( * ) Notice: Subject to any disclaimer, the term of this patent is extended or adjusted under 35 U.S.C. 154(b) by 0 days.

(21) Appl. No.: 16/331,910

(22) PCT Filed: Aug. 29, 2017

(86) PCT No.: PCT/JP2017/030928
§ 371 (c)(1),
(2) Date: Mar. 8, 2019

(87) PCT Pub. No.: WO2018/047676
PCT Pub. Date: Mar. 15, 2018

(65) Prior Publication Data
US 2019/0245315 A1    Aug. 8, 2019

(30) Foreign Application Priority Data

Sep. 9, 2016   (JP) ................................. 2016-176485

(51) Int. Cl.
*H03L 7/26* (2006.01)
*H03B 17/00* (2006.01)
(Continued)

(52) U.S. Cl.
CPC ............... *H01S 1/06* (2013.01); *G04F 5/145* (2013.01); *H01S 5/0687* (2013.01); *H03B 17/00* (2013.01); *H03L 7/26* (2013.01)

(58) Field of Classification Search
CPC ... G04F 5/145; G04F 5/14; H01S 1/05; H03L 7/26; H03B 17/00
See application file for complete search history.

(56) References Cited

FOREIGN PATENT DOCUMENTS

CN       107014555 A    *  8/2017
JP       2014-192669       10/2014

OTHER PUBLICATIONS

Kozlova, Olga, Stéphane Guérandel, and Emeric de Clercq. "Temperature and pressure shift of the Cs clock transition in the presence of buffer gases: Ne, N 2, Ar.";Physical Review A;83.6 (2011): 062714. (Year: 2011).*

(Continued)

*Primary Examiner* — Ryan Johnson
(74) *Attorney, Agent, or Firm* — Knobbe, Martens, Olson & Bear, LLP (57) ABSTRACT

The present invention provides an atomic oscillator comprising: a first frequency synthesizer for multiplying a reference frequency signal oscillated with a first voltage control oscillator by a first multiplication ratio and synthesizing a first high frequency signal; a first semiconductor laser for emitting a first laser light modulated by the first high frequency signal; a second frequency synthesizer for multiplying an output signal oscillated by a second voltage control oscillator with a second multiplication ratio and synthesizing a second high frequency signal; a second semiconductor laser for emitting a second laser modulated by the second high frequency signal; a gas cell being emitted with the first laser light and the second laser light simultaneously, the gas cell enclosing a first alkali-metal atom gas, a second alkali-metal atom gas, and buffer gas; and a computer for setting the first multiplication ratio in the first frequency synthesizer.

4 Claims, 6 Drawing Sheets

(51) Int. Cl.
*G04F 5/14* (2006.01)
*H01S 1/06* (2006.01)
*H01S 5/0687* (2006.01)

(56) References Cited

OTHER PUBLICATIONS

T. Driskel et al., Measuring Buffer-Gas Pressure in Sealed Glass Cells, Frequency Control Symposium & the European Frequency and Time Forum, 2015 Joint Conference of the IEEE International, Apr. 12, 2015.
D. J. Seidel, Two different atomic oscillators in the same environment: A new technique for compensating perpetuations., Frequency Control Symposium, 1996 $50^{th}$., Proceedings of the 1996 IEEE International, Jun. 5, 1996.
International Search Report, Application No. PCT/JP2017/030928, dated Oct. 17, 2017, in 4 pages.

* cited by examiner

ATOMIC OSCILLATOR

BACKGROUND OF THE INVENTION

Field of the Invention

The present invention relates to an atomic oscillator and more particularly relates to an atomic oscillator employing CPT resonance.

Description of the Related Art

Atomic oscillators employing CPT resonance may be configured with a quantum part only including an optical element and thus facilitates miniaturization and power saving, and are expected to be applied to a wide range of applications (e.g., Patent Document 1).

However, atomic oscillators using gas cells that enclose alkaline gas and buffer gas have shifted resonance frequency due to long-term fluctuation of buffer-gas pressure caused by leakage of the buffer gas and the like (buffer gas shift), and thus there is a limitation in long-term frequency stability.

CITATION LIST

Patent Literature

[Patent Document 1] Japanese Patent Application Publication No. 2007-336136

SUMMARY OF THE INVENTION

Technical Problem

The present invention has been achieved in consideration of the problems belonging to the aforementioned conventional technologies and directs to provide a gas-cell type atomic oscillator that maintains high frequency stability for a long period.

Solution to Problem

In a gas-cell type atomic oscillator, when an atomic resonance frequency is shifted by fluctuations of gas pressure of buffer gas enclosed in a gas cell, an atomic oscillator controlled synchronously with the resonance frequency may lose reliability of an oscillation frequency.

In this regard, the inventor focused on the fact that the impact of fluctuations of buffer-gas pressure on the resonance frequency depending on the kind of atoms, and has reached an idea that two different kinds of alkali-metal atoms are enclosed in the gas cell. Under this idea, the inventor further proceeded the studies and has found that the fluctuated buffer-gas pressure can be estimated by measuring resonance frequency of each atoms enclosed in a gas cell to complete the present invention.

Namely, the present invention provides a gas-cell type atomic oscillator employing CPT resonance, comprising: a first frequency synthesizer for multiplying a reference frequency signal oscillated by a first voltage control oscillator with a first multiplication ratio and synthesizing a first high frequency signal; a first semiconductor laser for emitting a first laser light attenuated by the first high frequency signal; a second frequency synthesizer for multiplying an output signal oscillated by a second voltage control oscillator with a second multiplication ratio and synthesizing a second high frequency signal; a second semiconductor laser for emitting a second laser modulated by the second high frequency signal; a second frequency synthesizer for multiplying an output signal oscillated by a second voltage control oscillator with a second multiplication ratio and synthesizing a second high frequency signal; a second semiconductor laser for emitting a second laser modulated by the second high frequency signal; a gas cell into which the first laser light and the second laser light enter simultaneously; the gas cell enclosing a first alkali-metal atom gas, a second alkali-metal atom gas, and buffer gas; and a computer for setting up the first multiplication ratio in the first frequency synthesizer; the computer comprising: a frequency ratio calculator for calculating a frequency ratio of the first high frequency signal to the second high frequency signal, a buffer-gas pressure estimator for estimating gas pressure of the buffer gas based on the calculated frequency ratio, a resonance frequency estimator for estimating the resonance frequency of the first alkali-metal atom based on the estimated gas pressure, and a multiplication ratio calculator for calculating the first multiplication ratio based on the estimated resonance frequency of the first alkali-metal atom.

Advantageous Effects of Invention

As mentioned above, the present invention may provide a gas-cell type atomic oscillator maintaining high frequency stability for a long period.

DETAILED DESCRIPTION OF THE PREFERRED EMBODIMENT

The present invention will now be described below with reference to the embodiments shown in the drawings, but the present invention is not limited to the embodiments shown in the drawings. Incidentally, each figure to be referred below will employ the same signs for common components, and abbreviate the explanation if appropriate.

An atomic oscillator of an embodiment in the present invention is an oscillator configured so as to utilize transparency phenomenon occurred with CPT (Coherent Population Trapping) resonance of alkali-metal atoms enclosed in a gas cell to generate an extremely stable frequency signal.

Figure 1:
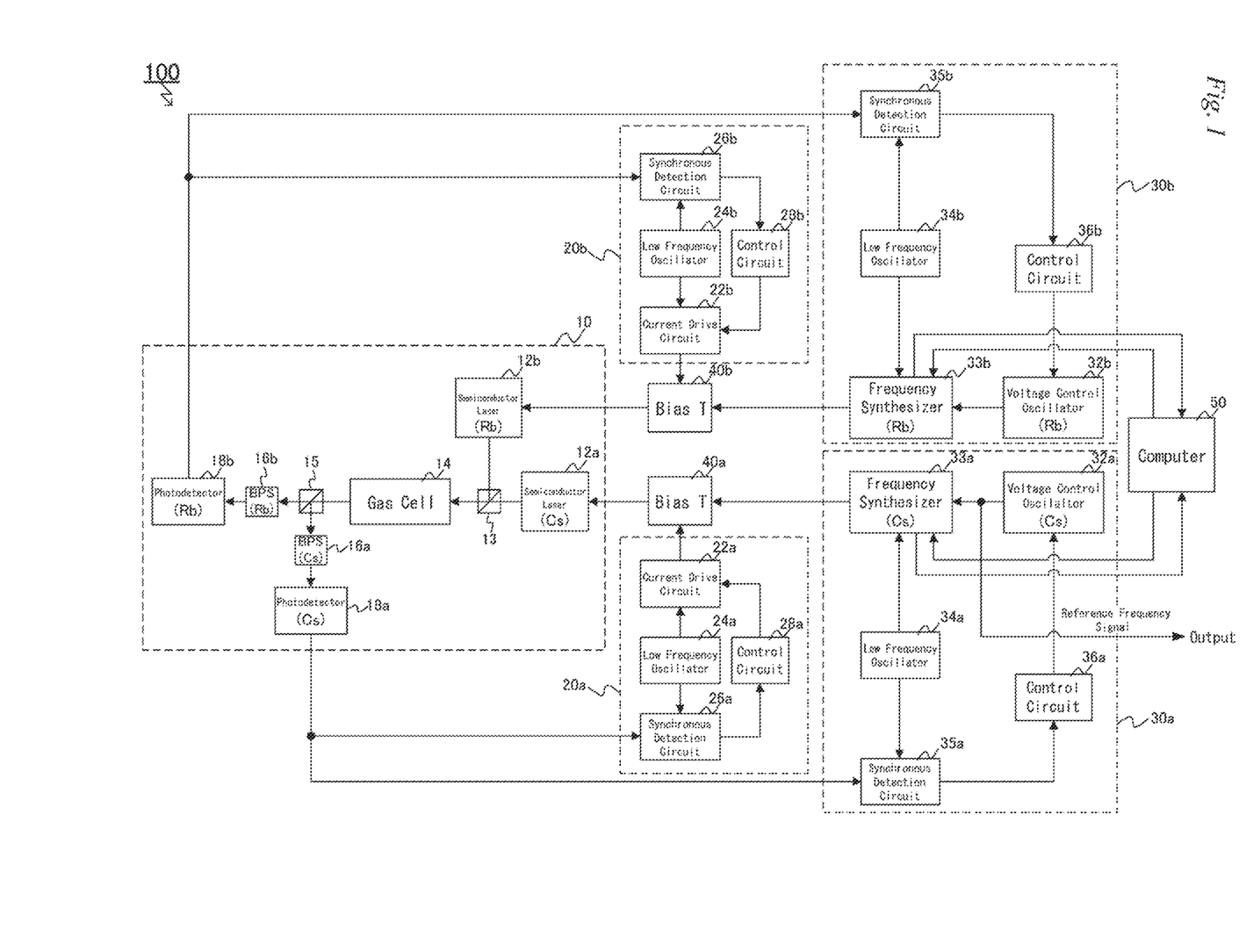
FIG. 1 shows a hardware configuration diagram of an atomic oscillator of the embodiment.

FIG. 1 illustrates a hardware configuration of an atomic oscillator 100, an embodiment of the present invention. As shown in FIG. 1, the atomic oscillator 100 of the embodiment may be configured including a quantum part 10, two wavelength control parts 20a and 20b, two frequency control parts 30a and 30b, two bias T 40a and 40b, and a computer 50 controlling the atomic oscillator 100. Each of the components will be described below.

First, the quantum part 10 will be described.

The quantum part 10 is configured including two semiconductor lasers 12a and 12b, a gas cell 14, two photodetectors 18a and 18b, a temperature control means for maintaining a constant temperature of the quantum part 10 (not shown).

Here, in one embodiment, the gas cell 14 encloses two types of alkali-metal gases and a buffer gas. The two types of alkali-metal atoms herein mean atoms each having different atomic numbers and different CPT resonance frequencies, and such types are not limited, but a combination of isotopes (e.g., naturally-occurring Rb containing $^{85}$Rb and $^{87}$Rb at a ratio of 72:28) is not considered as two types of alkali-metal atoms. The following description will exemplarily explain the case of the gas cell 14 enclosing cesium (Cs) and rubidium (Rb), for convenience.

Meanwhile, in one embodiment, one or more gases selected from inert gases such as He, Ne, Ar, and $N_2$ may be used as buffer gases. Additionally, in order to reduce a temperature-dependent frequency shift, the gas cell 14 may enclose two types of gases having different directions of frequency shifts.

A first semiconductor laser 12a (hereinafter also sometimes referred to as a semiconductor laser [Cs]) is an excitation light source for cesium (Cs), is driven with a drive current input from bias T 40a, and emits a laser light with an absorption wavelength band of cesium (Cs) (894 nm). On the other hand, a second semiconductor laser 12b (hereinafter also sometimes referred to as a semiconductor laser [Rb]) is an excitation light source for rubidium (Rb), is driven with a drive current input from bias T 40b, and emits a laser light with an absorption wavelength band of rubidium (Rb) (795 nm). Incidentally, in one embodiment, Vertical Cavity Surface Emitting LASER (VCSEL) may be preferably used as the semiconductor lasers 12a and/or 12b.

In one embodiment, two laser lights emitted from the two semiconductor lasers 12a and 12b are merged in a beam splitter 13 (a split ratio of 50:50), and then simultaneously enter into the gas cell 14. Subsequently, the laser lights transmitted through the gas cell 14 are split into two lights (a split ratio of 50:50) at the beam splitter 15, and then one of the lights passes through a bandpass filter 16a for transmitting selectively an excitation light of cesium (Cs) (894 nm), and enters into the photodetector 18a for cesium, while the other light passes through the bandpass filter 16b for transmitting selectively an excitation light of rubidium (Rb) (795 nm), and enters into the photodetector 18b for rubidium. Then, the two photodetectors 18a and 18b photoelectrically convert the transmitted lights thus received and output photodetection signals (direct-current voltage).

Here, one embodiment is configured so that a photodetection signal from the cesium photodetector 18a (hereinafter sometimes referred to as a photodetector [Cs]) may be input into the wavelength control part 20a and the frequency control part 30a, while a photodetection signal output from the rubidium photodetector 18b (hereinafter sometimes referred to as a photodetector [Rb]) may be input into the wavelength control part 20b and the frequency control part 30b.

As the quantum part 10 has been described so far, the wavelength control parts 20a and 20b will now be described below.

First, the wavelength control part 20a will be described. The wavelength control part 20a is configured with comprising a current drive circuit 22a, a low frequency oscillator 24a, a synchronous detection circuit 26a, and a control circuit 28a.

The current drive circuit 22a inputs a drive current for driving the semiconductor laser [Cs] into a bias T40a. Now, the drive current output from the current drive circuit 22a is modulated with an oscillation frequency of the low frequency oscillator 24a. Meanwhile, the synchronous detection circuit 26a synchronously detects a photodetection signal input from the photodetector [Cs], by a low frequency signal oscillated from the low frequency oscillator 24a, and then outputs a voltage signal to the control circuit 28a. Upon receiving this, the control circuit 28a controls an output current of the current drive circuit 22a so as to reduce a voltage input from the synchronous detection circuit 26a to zero. As a result, a wavelength of the laser light of semiconductor laser [Cs] is locked so that cesium (Cs) enclosed in the gas cell 14 may maintain its excitation level.

Next, the wavelength control part 20b will be described below. The wavelength control part 20b is configured with comprising a current drive circuit 22b, a low frequency oscillator 24b, a synchronous detection circuit 26b, and a control circuit 28b, and serves the same function as the aforementioned wavelength control part 20a.

In other words, the current drive circuit 22b inputs, for driving the semiconductor laser [Rb], a drive current modulated with an oscillation frequency of the low frequency oscillator 24b into the bias T40b. On the other hand, the synchronous detection circuit 26b synchronously detects a photodetection signal input from the photodetector [Rb], by a low frequency signal oscillated from the low frequency oscillator 24b, and then outputs a voltage signal to the control circuit 28b. Upon receiving this, the control circuit 28b controls an output current of the current drive circuit 22b so as to bring a voltage input from the synchronous detection circuit 26b to zero. As a result, a wavelength of the laser light of semiconductor laser [Rb] is locked so that rubidium (Rb) enclosed in the gas cell 14 may maintain its excitation level.

As the wavelength control parts 20a and 20b have been described so far, the frequency control parts 30a and 30b will now be described below.

First, the frequency control part 30a will be described. The frequency control part 30a may be configured with comprising a voltage control oscillator 32a, a frequency synthesizer 33a (hereinafter sometimes referred to as a frequency synthesizer [Cs]), a low frequency oscillator 34a, a synchronous detection circuit 35a, and a control circuit 36a.

The voltage control oscillator 32a is a voltage-controlled oscillator with an output frequency variably controlled depending on a control voltage applied from the control circuit 36a, and in the embodiment, the oscillation signal of the voltage control oscillator 32a is externally output as a reference frequency signal (e.g., 10 MHz) of the atomic oscillator 100, as well as input as a reference signal into the frequency synthesizer 33a. Additionally, the embodiment does not limit a vibration source to the voltage control oscillator 32a, the voltage control oscillator 32a may be a crystal oscillator or a MEMS oscillator (a silicon oscillator).

On the other hand, the frequency synthesizer 33a may be a PLL synthesizer synthesizing a high frequency signal (RF signal) for applying FM modulation to the drive current of the semiconductor laser [Cs] to produce ±1st side-band light required for CPT resonance of cesium (Cs), and more specifically may be a fractional-N PLL synthesizer capable of controlling an output frequency with a resolution of 1 Hz or less. The frequency synthesizer 33a multiplies the reference signal input from the voltage control oscillator 32a by a preset multiplication ratio, and synthesizes an RF signal having a frequency corresponding to a half of the resonance frequency of cesium (Cs). Then, the frequency synthesizer 33a simultaneously outputs the synthesized RF signal to both the bias T40a and the computer 50.

Now, default values of the fractional-N PLL parameters (specifically, a division ratio) for determining the multiplication ratio of the frequency synthesizer 33a, where a default value of the resonance frequency of cesium (Cs) enclosed in the gas cell 14 is described as $F_{Cs}$, may be set so as to fulfill the multiplication ratio derived by dividing $1/2F_{Cs}$ by a target frequency of the reference frequency signal output from the atomic oscillator 100. For example, if $F_{Cs}$ is 9.192651718 GHz and the target frequency of the atomic oscillator 100 is 10 MHz, the multiplication ratio to be fulfilled by the frequency synthesizer 33a may be $(1/2F_{Cs})/10$ MHz=459.6325859, thereby setting the values fulfilling this multiplication ratio (=459.6325859) as the default values for the parameters of the frequency synthesizer 33a.

The RF signal synthesized by the frequency synthesizer 33a (hereinafter sometimes referred to as an RF signal [Cs]) is modulated with an oscillation frequency of the low frequency oscillator 34a and input into the bias T40a. Thus, the drive current input from the current drive circuit 22a is simultaneously applied with FM modulation based on the frequency of the RF signal synthesized by the frequency synthesizer 33a and AM modulation based on the oscillation frequency of the low frequency oscillator 24a.

On the other hand, the synchronous detection circuit 35a synchronously detects a photodetection signal input from the photodetector [Cs] by a low frequency signal oscillated from the low frequency oscillator 34a, and then outputs a voltage signal to the control circuit 36a. Upon receiving this, the control circuit 36a applies a control voltage to the voltage control oscillator 32a so as to reduce a voltage input from the synchronous detection circuit 35a to zero. As a result, a frequency of the RF signal [Cs] output from the frequency synthesizer 33a may be locked so as to maintain CPT resonance of cesium (Cs) enclosed in the gas cell 14.

Next, the frequency control part 30b will be described below. The frequency control part 30b is configured with comprising a voltage control oscillator 32b, a frequency synthesizer 33b (hereinafter sometimes referred to as a frequency synthesizer [Rb]), a low frequency oscillator 34b, a synchronous detection circuit 35b, and a control circuit 36b, and serves the same function as the aforementioned frequency control part 30a.

In other words, a reference signal oscillated by the voltage control oscillator 32b is input into the frequency synthesizer 33b (a fractional-N PLL synthesizer), and the frequency synthesizer 33b synthesizes, based on the input reference signal, an RF signal having a frequency corresponding to a half of the resonance frequency of rubidium (Rb). Then, the frequency synthesizer 33b outputs simultaneously the synthesized RF signal to both the bias T 40b and the computer 50.

Here, default values of the fractional-N PLL parameters for determining the multiplication ratio of the frequency synthesizer 33b, where a default value of the resonance frequency of rubidium (Rb) enclosed in the gas cell 14 is described as $F_{Rb}$, may be set so as to fulfill the multiplication ratio derived by dividing $1/2F_{Rb}$ by a target frequency of the reference frequency signal output from the atomic oscillator 100. For example, if $F_{Rb}$ is 6.834696360 GHz and the target frequency of the atomic oscillator 100 is 10 MHz, the multiplication ratio to be fulfilled by the frequency synthesizer 33b may be $(1/2F_{Rb})/10$ MHz=341.734818, thereby setting the values fulfilling this multiplication ratio (=341.734818) as the default values for the parameters of the frequency synthesizer 33b.

The RF signal synthesized by the frequency synthesizer 33b (hereinafter sometimes referred to as an RF signal [Rb]) is modulated with an oscillation frequency of the low frequency oscillator 24b and input into the bias T 40b. Thus, the drive current input from the current drive circuit 22b is simultaneously applied with FM modulation based on the frequency of the RF signal synthesized by the frequency synthesizer 33b, and AM modulation based on the oscillation frequency of the low frequency oscillator 24b.

On the other hand, the synchronous detection circuit 35b synchronously detects a photodetection signal input from the photodetector [Rb], by a low frequency signal oscillated from the low frequency oscillator 34b, and then outputs a voltage signal to the control circuit 36b. Upon receiving this, the control circuit 36b applies a control voltage to the voltage control oscillator 32b so as to reduce a voltage input from the synchronous detection circuit 35a to zero. As a result, a frequency of the RF signal [Rb] output from the frequency synthesizer 33b may be locked so as to maintain CPT resonance of rubidium (Rb) enclosed in the gas cell 14.

As the frequency control parts 30a and 30b have been described so far, the computer 50 will now be described below.

The computer 50 implemented on the atomic oscillator 100 may be, for example, a microcomputer, and may be responsible for controlling a temperature control means (not depicted) of the quantum part 10, and otherwise setting optimal parameters suited for pressure fluctuation of the buffer gas for two frequency synthesizers 33a and 33b.

Figure 2:
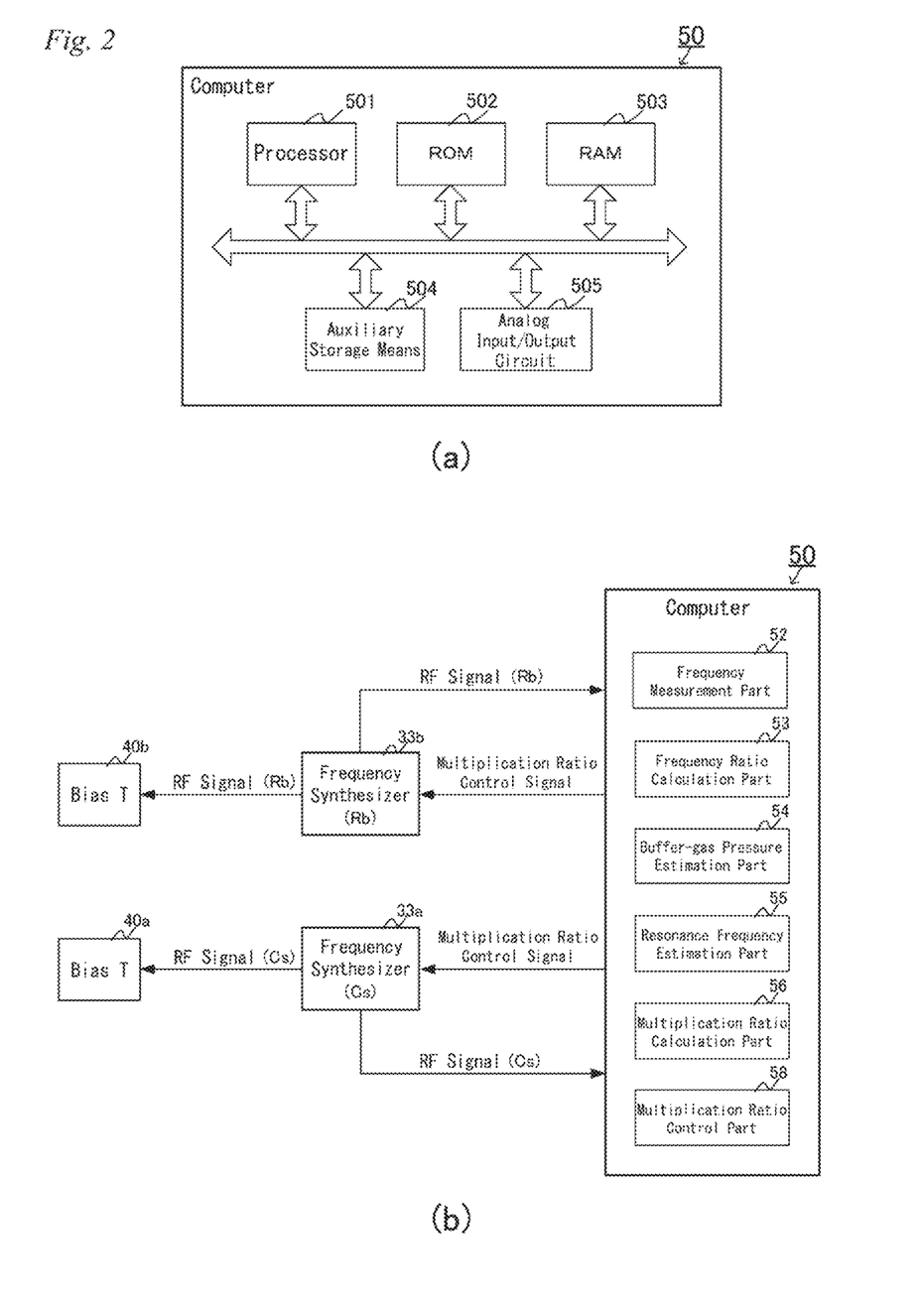
FIG. 2 shows a configuration diagram of a computer mounted in an atomic oscillator of the embodiment.

FIG. 2(a) shows a hardware configuration of the computer 50. As shown in FIG. 2(a), the computer 50 comprises a processor 501, a ROM 502 for storing predetermined programs described later, a RAM 503 for providing an execution space for the programs, an auxiliary storage means 504 for storing time-series data of frequencies described later, and an analog input/output circuit 505 for executing A/D conversion of input signals and D/A conversion of output signals.

FIG. 2(b) shows a functional configuration of the computer 50. As shown in FIG. 2(b), the computer 50 is configured with comprising a frequency measurement part 52, a frequency ratio calculation part 53, and a buffer-gas pressure estimation part 54, a resonance frequency estimation part 55, a multiplication ratio calculation part 56, and a multiplication ratio control part 58. Additionally, each of the aforementioned functional parts may be realized by executing predetermined programs by the computer 50.

The frequency measurement part 52 is a functional part that measures a frequency of the RF signal [Cs] to be input into the computer 50 (hereinafter sometimes referred to as a frequency [Cs]) and a frequency of the RF signal [Rb] to be input into the computer 50 (hereinafter sometimes referred to as a frequency [Rb]) and applies smoothing on time-series data of the measured frequency [Cs] and frequency [Rb] using a known smoothing technique (e.g., moving average technique), and records them in a temporary memory.

In this point, the frequency measurement part 52 measures the two RF signal frequencies to be input into the computer 50 using a common time standard. For example, the frequency measurement part 52 measures the frequency [Cs] and the frequency [Rb] using any one of the two RF signals input into the computer 50, as the time standard. For example, in the case that the RF signal [Rb] is used as a time standard, the frequency measurement part 52 simultaneously starts counting the number of pulses of the RF signal [Rb] and the RF signal [Cs] input into the computer 50, then simultaneously finishes counting the two RF signals when the count of the RF signal [Rb] reaches the number corresponding to the resonance frequency of rubidium (Rb) (e.g., $6.8 \times 10^9$ counts), obtains the resulting count of the RF signal [Rb] as a frequency [Rb] and obtain the count of the RF signal [Cs] as a frequency [Cs].

Further, as another method, the frequency measurement part 52 may measure the frequency [Cs] and the frequency [Rb] with a known method using a time standard defined by an inner clock signal of the computer 50.

The frequency ratio calculation part 53 is a functional part that calculates a frequency ratio of RF signal [Cs] to RF signal [Cs].

The buffer-gas pressure estimation part 54 is a functional part that estimate gas pressure of the buffer gas enclosed in the gas cell 14, based on the calculated frequency ratio.

The resonance frequency estimation part 55 is a functional part that estimate resonance frequency of cesium (Cs) and resonance frequency of rubidium (Rb), based on the estimated gas pressure of the buffer gas.

The multiplication ratio calculation part 56 is a functional part that calculates a multiplication ratio to be set up for the frequency synthesizer [Cs], based on the estimated resonance frequency of cesium (Cs) and calculates a multiplication ratio to be set up for frequency synthesizer [Rb], based on he estimated resonance frequency of rubidium (Rb).

The multiplication ratio control part 58 is a functional part that sets up the calculated multiplication ratio for the frequency synthesizer [Cs] and the frequency synthesizer [Rb].

Figure 3:
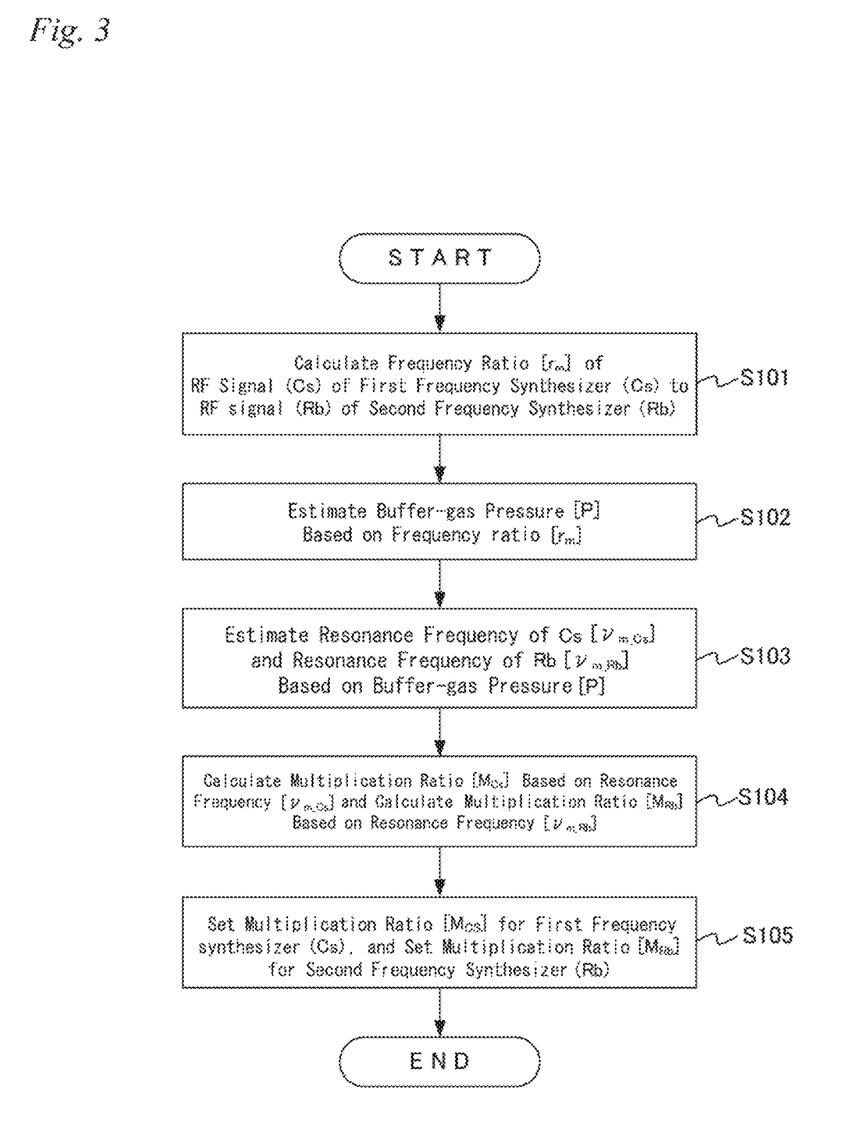
FIG. 3 shows a flowchart of processes to be performed by a computer mounted in an atomic oscillator of the embodiment.

As the functional configuration of the computer 50 has been described so far, the content of processing cooperatively executed by each of the aforementioned functional parts will now be described based on a flowchart shown in FIG. 3. Further, the following description will refer to FIG. 2, accordingly.

First, at step 101, the frequency ratio calculation part 53 retrieves the latest frequency [Cs] and frequency [Rb] from time-series data of frequencies recorded in a temporary memory, and calculates a frequency ratio (frequency [Cs]/frequency [Rb]).

At the next step 102, the buffer-gas pressure estimation part 54 estimates buffer-gas pressure enclosed in the gas cell 14, based on the frequency ratio calculated at the preceding step 101 (frequency [Cs]/frequency [Rb]). Specifically, the frequency ratio calculated by the frequency ratio calculation part 53 is substituted into a predetermined estimation formula to calculate an estimated value of the buffer-gas pressure. Now the estimation formula for the buffer-gas pressure employed by the embodiment will be described.

In gas-cell type atomic oscillators, a resonance frequency of atoms enclosed in a gas-cell shifts depending on buffer-gas pressure and gas-cell temperature. Then, when buffer-gas pressure is represented as P, variability of gas-cell temperature is represented as $\Delta T$, pressure coefficient is represented as $\alpha$, and temperature coefficient is represented as $\delta$, the shift of resonance frequency $\Delta\nu$ of atoms may be expressed as the following formula (1).

$$\Delta\nu = P[\alpha + \delta_1 \Delta T + \delta_2 (\Delta T)^2 + \dots] \tag{1}$$

Now assuming that the gas-cell temperature is continuously controlled to a constant temperature, the temperature coefficient $\delta$ may be sufficient when taken only a primary term into account. Therefore, in one embodiment, the resonance frequency of cesium (Cs) [$\nu_{m\_Cs}$] enclosed in the gas cell 14 may be expressed as the formula (2) below, and the resonance frequency of rubidium (Rb) enclosed in the gas cell 14 [$\nu_{m\_Rb}$] may be expressed the formula (3) below.

$$\nu_{m\_Cs} = \nu_{Cs} + \Delta\nu_{Cs} = \nu_{Cs} + P[\alpha_{Cs} + \delta_{Cs}\Delta T] \tag{2}$$

$$\nu_{m\_Rb} = \nu_{Rb} + \Delta\nu_{Rb} = \nu_{Rb} + P[\alpha_{Rb} + \delta_{Rb}\Delta T] \tag{3}$$

Additionally, in the formula (2) above, $\nu_{Cs}$, $\alpha_{Cs}$, and $\delta_{Cs1}$ the represent nominal frequency, pressure coefficient, and primary temperature coefficient of cesium (Cs), respectively. Further, in the formula (3) above, $\nu_{Rb}$, $\alpha_{Rb}$, and $\delta_{Rb1}$ represent the nominal frequency, pressure coefficient and primary temperature coefficient of rubidium (Rb), respectively (hereinafter as referred in the same manner).

From the formula (2) and (3), a ratio of the resonance frequency of cesium (Cs) [$\nu_{m\_Cs}$] to the resonance frequency of rubidium (Rb) [$\nu_{M\_Rb}$] ($\nu_{m\_Cs}/\nu_{m\_Rb}$) enclosed in the gas cell 14 may be expressed as the following formula (4).

$$\frac{\nu_{m\_Cs}}{\nu_{m\_Rb}} = \frac{\nu_{Cs} + P\alpha_{Cs} + P\Delta T \delta_{Cs1}}{\nu_{Rb} + P\alpha_{Rb} + P\Delta T \delta_{Rb1}} \approx \frac{\nu_{Cs} + P\alpha_{Cs}}{\nu_{Rb} + P\alpha_{Rb}} \tag{4}$$

Now assuming that the temperature of the gas cell 14 is continuously controlled to a constant temperature, when the $\Delta T$ in the abovementioned formula (4) is zero and then the formula (4) is arranged for the buffer-gas pressure [P], the formula (5) is derived.

$$P = \frac{\nu_{Cs}\frac{\nu_{m\_Cs}}{\nu_{m\_Rb}}\nu_{RB}}{\frac{\nu_{m\_Cs}}{\nu_{m\_Rb}}\alpha_{Rb} - \alpha_{Cs}} \tag{5}$$

Finally, substitution of the frequency ratio ($\nu_{m\_Cs}/\nu_{m\_Rb}$) to the abovementioned formula (5) with $r_m$, results in the formula (6) below as a formula for the buffer-gas pressure [P].

$$P = \frac{\nu_{Cs} - r_m \nu_{Rb}}{r_m \alpha_{Rb} - \alpha_{Cs}} \tag{6}$$

Then, at step 102, the buffer-gas pressure estimation part 54 substitutes the frequency ratio $r_m$ ($=\nu_{m\_Cs}/\nu_{m\_Rb}$) calculated at the preceding step 101 into the abovementioned formula (6) to calculate an estimated buffer-gas pressure [P] of the gas cell 14.

At the next step 103, the resonance frequency estimation part 55 estimates resonance frequency of cesium (Cs) [$\nu_{m\_Cs}$] and resonance frequency of rubidium (Rb) [$\nu_{m\_Rb}$] based on the buffer-gas pressure [P] estimated at the preceding step 102. Specifically, the buffer-gas pressure [P] is substituted into the aforementioned formula (1) and formula (2), thereby calculating estimated values of the resonance frequency[$\nu_{m\_Cs}$] and the resonance frequency[$\nu_{m\_Rd}$].

Then, at step 104, the multiplication ratio calculation part 56 calculates a multiplication ratio [$M_{Cs}$] to be set for the frequency synthesizer [Cs] based on the resonance frequency [$\nu_{m\_Cs}$] calculated at the preceding step 103, as well as calculates a multiplication ratio [$M_{Rb}$] to be set for the frequency synthesizer [Rb] based on the resonance frequency [$\nu_{m\_Rb}$] calculated at the preceding step 103. Specifically, a half of the calculated resonance frequency [$\nu_{m\_Cs}$] is divided by a target frequency of the atomic oscillator 100 to calculate a value as the multiplication ratio [$M_{Cs}$], while a half of the calculated resonance frequency [$v_{m\_Rd}$] is divided by a target frequency of the atomic oscillator 100 to calculate a value as the multiplication ratio [$v_{m\_Rd}$].

Continuously at step 105, the multiplication ratio control part 58 sets the multiplication ratio [$M_{Cs}$] calculated at the preceding step 104 for the frequency synthesizer [Cs], and sets the multiplication ratio [$M_{Rb}$] at the preceding step 104 for the frequency synthesizer [Rb]. Specifically, the multiplication ratio control part 58 calculates a parameter [$P_{r\_Cs}$] for realizing the multiplication ratio [$M_{Cs}$], then generates a multiplication ratio control signal for setting the parameter [$P_{r\_Cs}$], and transmits it to the frequency synthesizer [Cs]. Then, the frequency synthesizer [Cs] having received the multiplication ratio control signal updates the parameter. Moreover, the multiplication ratio control part 58 calculates a parameter [$P_{r\_Rd}$] for realizing the multiplication ratio [$M_{Rb}$], thereafter generates a multiplication ratio control signal for setting the parameter [$P_{r\_Rb}$], and transmits it to the frequency synthesizer [Rb]. Then, the frequency synthesizer [Rb] having received the multiplication ratio control signal updates the parameter.

In one embodiment, the computer 50 repeatedly executes the sequential processings mentioned above (steps 101-105) at predetermined timing. This minimizes the impact of variability of the buffer-gas pressure, and thus results in stabilization of oscillation frequencies of the atomic oscillator 100 over long periods.

Although the present invention has been described with referring to embodiments so far, the present invention is not limited to the aforementioned embodiments but will include any embodiment as long as it exhibits an action or effect of the present invention within the modes that may be occurred to those skilled in the art.

Each function of the aforementioned embodiments can be implemented by an apparatus-executable program coded by C, C++, C#, Java®, and the like, programs of the embodiments can be stored in an apparatus-readable storage media such as a hard disk devise, CD-ROM, MO, DVD, a flexible disk, EEPROM, EPROM to be distributed, and can also be transmitted via network in a format available by other apparatus.

EXAMPLES

A demonstrative experiment for an atomic oscillator of the present invention was performed as the following procedure.

Figure 4:
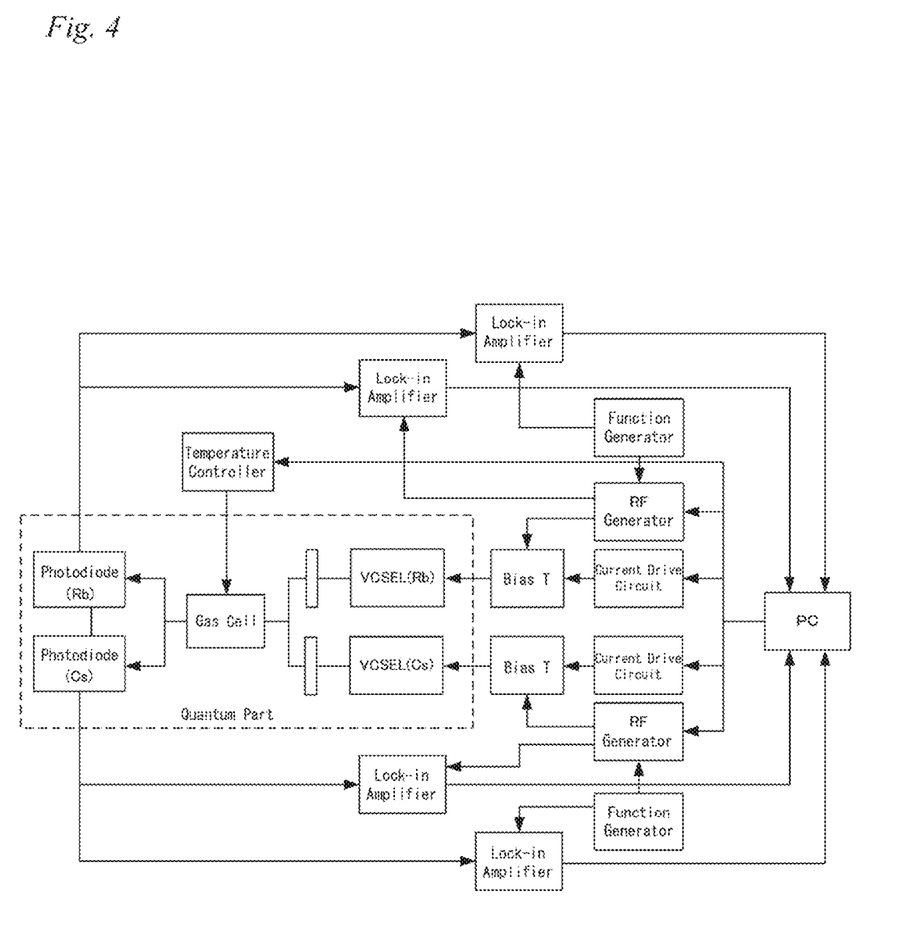
FIG. 4 shows an experimental apparatus.

FIG. 4 shows an experimental apparatus used in the experiment. In the experiment, a cell with an optical path length of 2 mm fabricated by MEMS process was used as a gas cell, $^{133}$Cs and natural Rb was enclosed therein as two types of alkali-metal atoms, and Ne was enclosed therein as a buffer gas. Moreover, during the experimental period, gas-cell temperature was maintained to 90° C., while the ambient temperature of the quantum part was monitored.

In the experiment, a VCSEL with an output wavelength of 895 nm (Cs-D$_1$ line) was provided as an excitation light source for Cs, while a VCSEL with an output wavelength of 795 nm (Rb-Di line) was provided as an excitation light source for Rb. Furthermore, RF was superimposed on each drive current of the VCSELs and applied with AM/FM modulation, thereby generating ±1st side band, which is an excitation light required for observing CPT resonance. An optical system in the experimental apparatus was configured so that two laser lights output from each VCSELs may be formed into parallel lights via a collimator lens, thereafter modulated to σ$^+$-polarized light via a ND filter and a$\lambda$/4 wavelength plate, and then merged on a half mirror to transmit through the same part of the gas cell. On the other hand, the transmitted lights through the gas cell was isolated with a bandpass filter for Cs (890±5 nm) and a bandpass filter for Rb (800±5 nm), and respectively detected by dedicated photodiodes.

In this experiment, for stabilization of laser wavelength and maintenance of the center frequency of CPT resonance, a lock-in amplifier was used to configure a feedback loop. Furthermore, in measurement of frequency, a cesium primary standard is connected as a reference to a RF generator for superimposing RF on VCSEL, and then output signal frequency of the RF generator was controlled and recorded using PC.

Figure 5:
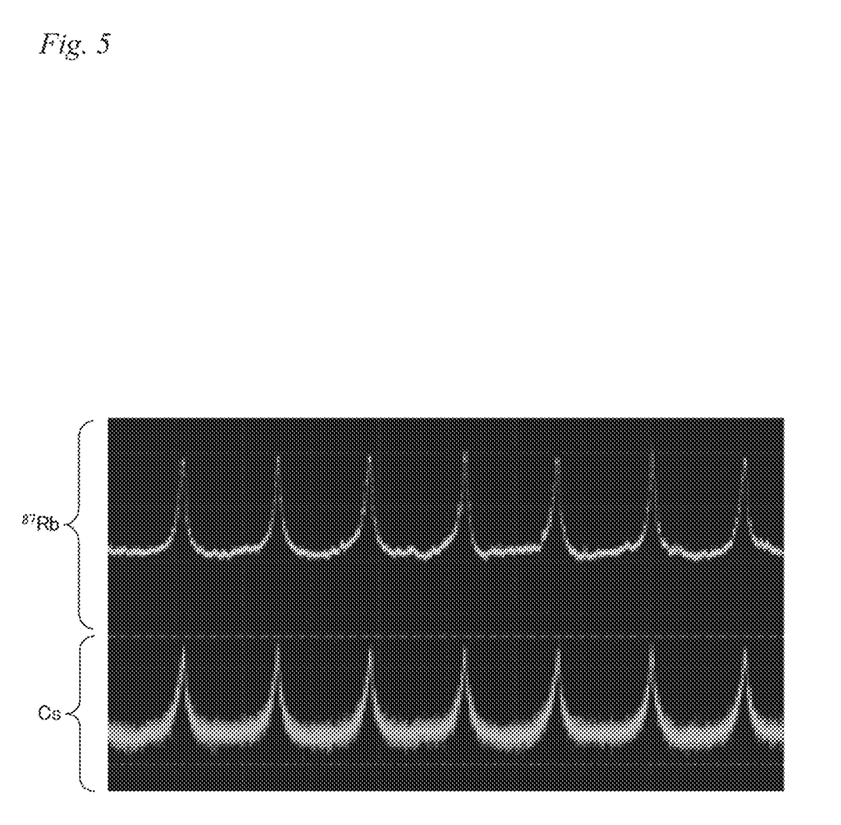
FIG. 5 shows CPT resonance lines for Cs and $^{87}$Rb.

FIG. 5 shows CPT resonance lines for Cs and $^{87}$Rb simultaneously observed. The results shown in FIG. 5 confirmed that, even though two types of alkali-metal atom (Cs, $^{87}$Rb) were enclosed together in a single gas cell, CPT resonances of each of the atoms could be observed without problems.

Figure 6:
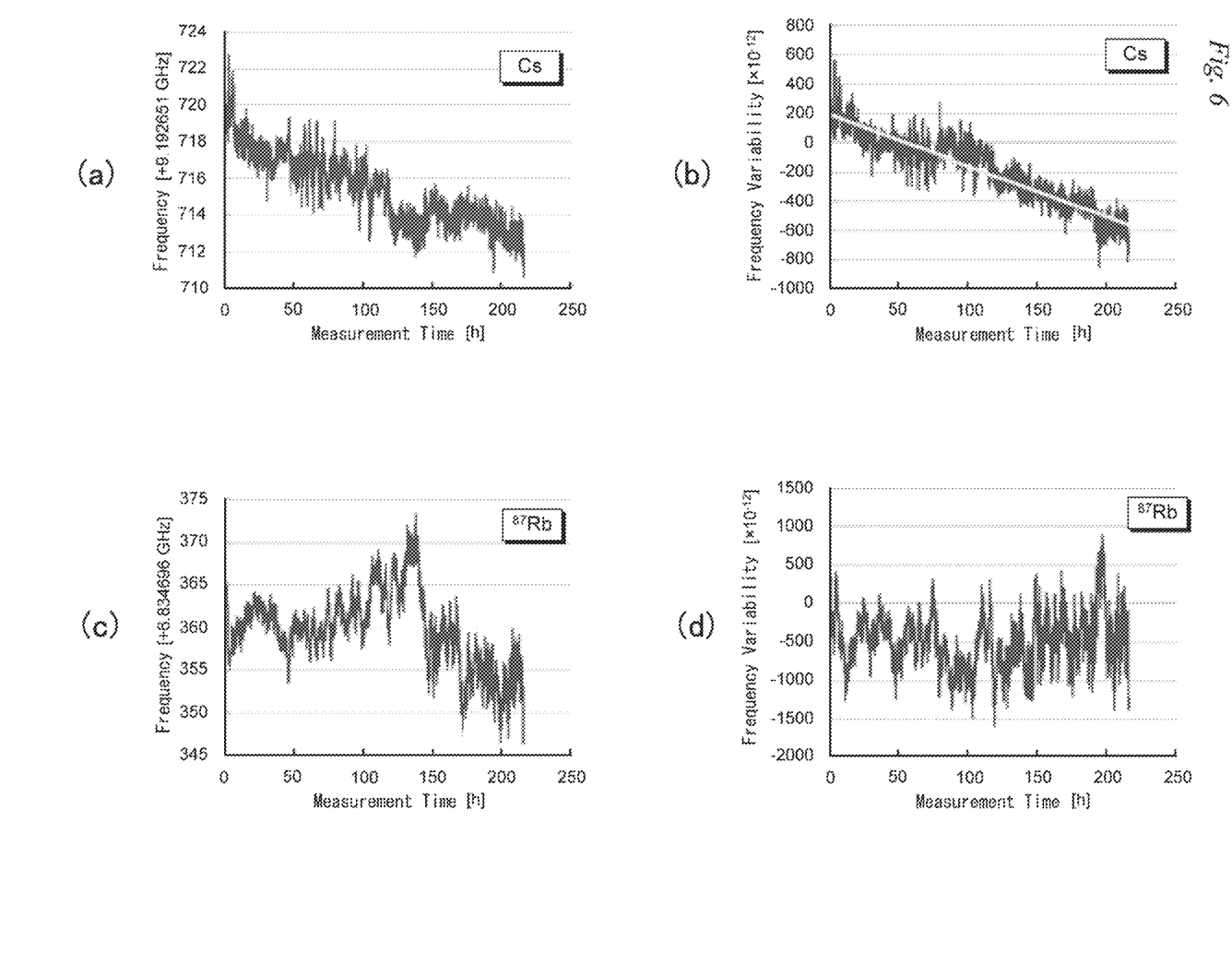
FIG. 6 shows a change-in-time of CPT resonance frequency and a change-in-time of frequency fluctuations for Cs and $^{87}$Rb.

Meanwhile, FIG. 6(a) shows a time course of the resonance frequency of Cs, and FIG. 6(b) shows a time course of frequency variability of the resonance frequency of Cs. Further, FIG. 6(c) shows a time course of the resonance frequency of $^{87}$Rb, and FIG. 6(d) shows a time course of frequency variability of the resonance frequency of $^{87}$Rb. Additionally, FIGS. 6(b) and (d) represent results applied with temperature correction based on measured results of ambient temperature in the quantum part. The results shown in FIG. 6 confirmed that two types of alkali-metal atoms (Cs and $^{87}$Rb) had difference in behaviors of the buffer gas shift.

DESCRIPTION OF SIGNS

10—quantum part; 12a, 12b—semiconductor laser; 13—beam splitter; 14—gas cell; 15—beam splitter; 16a, 16b—bandpass filter; 18a,18b—photodetector; 20a,20b—wavelength control part; 22a, 22b—current drive circuit; 24a, 24b—low frequency oscillator; 26a, 26b synchronous detection circuit; 28a, 28b—control circuit; 30a, 30b—frequency control part; 32a, 32b—voltage control oscillator; 33a, 33b—frequency synthesizer; 34a, 34b—low frequency oscillator; 35a, 35b—synchronous detection circuit; 36a, 36b—control circuit; 40a, 40b—bias T; 50—computer; 52—frequency measurement part; 53—frequency ratio calculation part; 54—buffer—gas pressure estimation part; 55—resonance frequency estimation part; 56—multiplication ratio calculation part; 58—multiplication ratio control part; 100—atomic oscillator; 501—processor; 502—ROM; 503—RAM; 504—auxilliary storage means; 505—analog input/output circuit.

What is claimed is:

1. A gas cell type atomic oscillator employing CPT resonance, comprising:
   a first frequency synthesizer for multiplying a reference frequency signal oscillated with a first voltage control oscillator by a first multiplication ratio and synthesizing a first high frequency signal;
   a first semiconductor laser for emitting a first laser light modulated by the first high frequency signal;
   a second frequency synthesizer for multiplying an output signal oscillated with a second voltage control oscillator by a second multiplication ratio and synthesizing a second high frequency signal;

a second semiconductor laser for emitting a second laser modulated by the second high frequency signal;
a gas cell being emitted with the first laser light and the second laser light simultaneously, the gas cell enclosing a first alkali-metal atom gas, a second alkali-metal atom gas, and buffer gas; and
a computer for setting the first multiplication ratio in the first frequency synthesizer,
the computer comprising:
a frequency ratio calculator for calculating a frequency ratio of the first high frequency signal to the second high frequency signal,
a buffer gas pressure estimator for estimating gas pressure of the buffer gas based on the calculated frequency ratio,
a resonance frequency estimator for estimating the resonance frequency of the first alkali-metal atom based on the estimated gas pressure, and
a multiplication ratio calculator for calculating the first multiplication ratio based on the estimated resonance frequency of the first alkali-metal atom.

2. The atomic oscillator of claim 1, wherein the buffer gas pressure estimator estimating the gas pressure based on the following formula:

$$P = \frac{v_1 - rv_2}{r\alpha_2 - \alpha_1}$$

wherein P represents the gas pressure; r represents the frequency ratio; $v_1$ represents a nominal frequency of the first alkali-metal atom; $v_2$ represents a nominal frequency of the second alkali-metal atom; $\alpha_1$ represents a pressure coefficient of the first alkali-metal atom; and $\alpha_2$ represents a pressure coefficient of the second alkali-metal atom.

3. The atomic oscillator of claim 1, the multiplication ratio calculator calculating as the first multiplication ratio, a value derived by dividing 1/2 value of the estimated resonance frequency of the first alkali-metal atom by a targeted frequency of the reference frequency signal.

4. The atomic oscillator of claim 2, the multiplication ratio calculator calculating as the first multiplication ratio, a value derived by dividing 1/2 value of the estimated resonance frequency of the first alkali-metal atom by a targeted frequency of the reference frequency signal.

* * * * *